(12) United States Patent
Pairitsch et al.

(10) Patent No.: US 6,762,440 B1
(45) Date of Patent: Jul. 13, 2004

(54) SEMICONDUCTOR COMPONENT AND CORRESPONDING TEST METHOD

(75) Inventors: Herbert Pairitsch, Klagenfurt (AT); Frank Pfirsch, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/169,920

(22) PCT Filed: Dec. 20, 2000

(86) PCT No.: PCT/EP00/13024
§ 371 (c)(1),
(2), (4) Date: Sep. 25, 2002

(87) PCT Pub. No.: WO01/54168
PCT Pub. Date: Jul. 26, 2001

(30) Foreign Application Priority Data

Jan. 18, 2000 (DE) .......................... 100 01 865

(51) Int. Cl.[7] .............................................. H01L 29/74
(52) U.S. Cl. ..................... 257/173; 257/327; 257/339; 257/355; 257/356; 257/367
(58) Field of Search ........................ 257/173, 327–346, 257/355–363, 367

(56) References Cited

U.S. PATENT DOCUMENTS 4,896,196 A * 1/1990 Blanchart et al. ........... 257/139
5,973,359 A * 10/1999 Kobayashi et al. ......... 257/328
6,246,092 B1 * 6/2001 Fujihira et al. ............. 257/341

FOREIGN PATENT DOCUMENTS

| DE | 4228832 A1 | 3/1994 |
| DE | 100 01 865 A1 | 8/2001 |
| EP | 0 845 813 A1 * | 3/1998 |
| EP | 0845813 A1 | 6/1998 |

OTHER PUBLICATIONS

Shen et al., "High Voltage Clamped IGBT for Automotive Ignition Applications," Proceedings of 1998 International Symposioum on Power Semiconductor Devices & ICs, Kyoto, p. 97–100, (Jun. 1998).

* cited by examiner

Primary Examiner—David Nelms
Assistant Examiner—Andy Huynh
(74) Attorney, Agent, or Firm—Jenkins, Wilson & Taylor, P.A.

(57) ABSTRACT

A semiconductor component having a first main terminal, a second main terminal, a gate terminal for controlling the current between the main terminals is provided. A first diode device can be switched between the first main terminal and the gate terminal. The first diode device has a first breakdown voltage such that the first diode device short-circuits the first main terminal with the gate terminal, thereby switching on the semiconductor component, when the voltage that drops off over the first diode device exceeds a certain predetermined value. The first diode device is connected to the control gate in an integrated manner and has an external contacting area for connecting to the first main terminal.

10 Claims, 7 Drawing Sheets

PRIOR ART

SEMICONDUCTOR COMPONENT AND CORRESPONDING TEST METHOD

TECHNICAL FIELD

The present invention relates to a semiconductor component having a first main terminal; a second main terminal; a control terminal for controlling the current flowing between the main terminals; and a first diode device, which can be connected between the first main terminal and the control terminal and has a first breakdown voltage such that it short-circuits the first main terminal to the control terminal and thus switches on the semiconductor component if the voltage dropped across the first diode device exceeds a predetermined value; the first diode device being connected to the control terminal in an integrated manner.

BACKGROUND ART

In this case, "short-circuiting" means that a current flow is made possible without a large additional resistance, while the voltage dropped across the first diode device is preserved.

Although applicable to any desired semiconductor components, the present invention and the problems on which it is based are explained with regard to vertical IGBT transistors or DMOS transistors.

In many applications of semiconductor power switches, the current is switched off in the case of an inductive load, for example for ignition transistors or ignition IGBTS. In this case, the current driven by the inductance, in avalanche breakdown, must be passed through the component if the component is not additionally protected. In this case, there is the risk of the component being irreversibly destroyed. One possibility for protection is active zener protection, as is known from J. Stengl, J. Tyihanyi, Leistung-MOS-FET-Praxis [Power MOS-FETs in practice], $2^{nd}$ Edition, pages 130–133, Pflaum Verlag Munich, 1992.

It essentially comprises a zener diode or a zener diode chain between the gate and the drain of the transistor to be protected, which switches on the gate when the breakdown voltage of the zener diode is exceeded, and thus enables a current flow without a further rise in the drain-source voltage. In this way, the current can be passed uniformly via the entire cell array of the transistor or IGBT. As a result, in the event of switch-off, a very high energy can be taken up in the component without the component being destroyed.

In order that this effect of the active zener protection is actually achieved, it is essential that the voltage at which avalanche breakdown commences locally (e.g. in the edge region) or else globally in the cell array (avalanche voltage) is higher than the breakdown voltage of the zener diode (zener voltage).

Z. John Shen, Stephen P. Robb, Proceedings of 1998 ISPSD, Kyoto, pp. 97–100 (1998), propose an IGBT with active zener protection by a polydiode chain. The polydiode chain is arranged above a locally widened section of the edge termination and is connected on one side to the gate and on the other side to an n-doped region (e.g. the channel stopper of the edge termination) which is at the collector potential (rear-side potential) when reverse voltage is present. The edge termination itself comprises floating field rings which have simply been widened in the region of the polydiodes (with unchanged distance between the field rings). The breakdown characteristic curve of such an IGBT with integrated zener diode shows only the voltage at which the IGBT starts to carry current via the MOS channel opened by the active zener protection, but not where the avalanche voltage of the IGBT lies.

In order to be able to guarantee an adequate safety margin between zener voltage and avalanche voltage whilst taking account of manufacturing variations, it is necessary, therefore, to put the avalanche voltage far in excess of the zener voltage, for example about 200 V in accordance with this document. This in turn has the effect that the forward voltage or the on resistance of the IGBT or of the transistor is correspondingly increased.

It is not possible to directly check the safety margin at the wafer level. Therefore, the energy which can be taken up without destruction in the case of an inductive switch-off operation can only be tested on completely constructed systems. Such a test is referred to as UIS test (UIS= Unclamped Inductive Switching).

EP 0 845 813 A1 discloses an arrangement in which a bonding wire is used to produce a conductive connection between the lead frame or substrate at rear-side potential and a base contact in order to enable the IGBT to be switched off more rapidly. However, this document does not deal with active zener protection.

Figure 5:
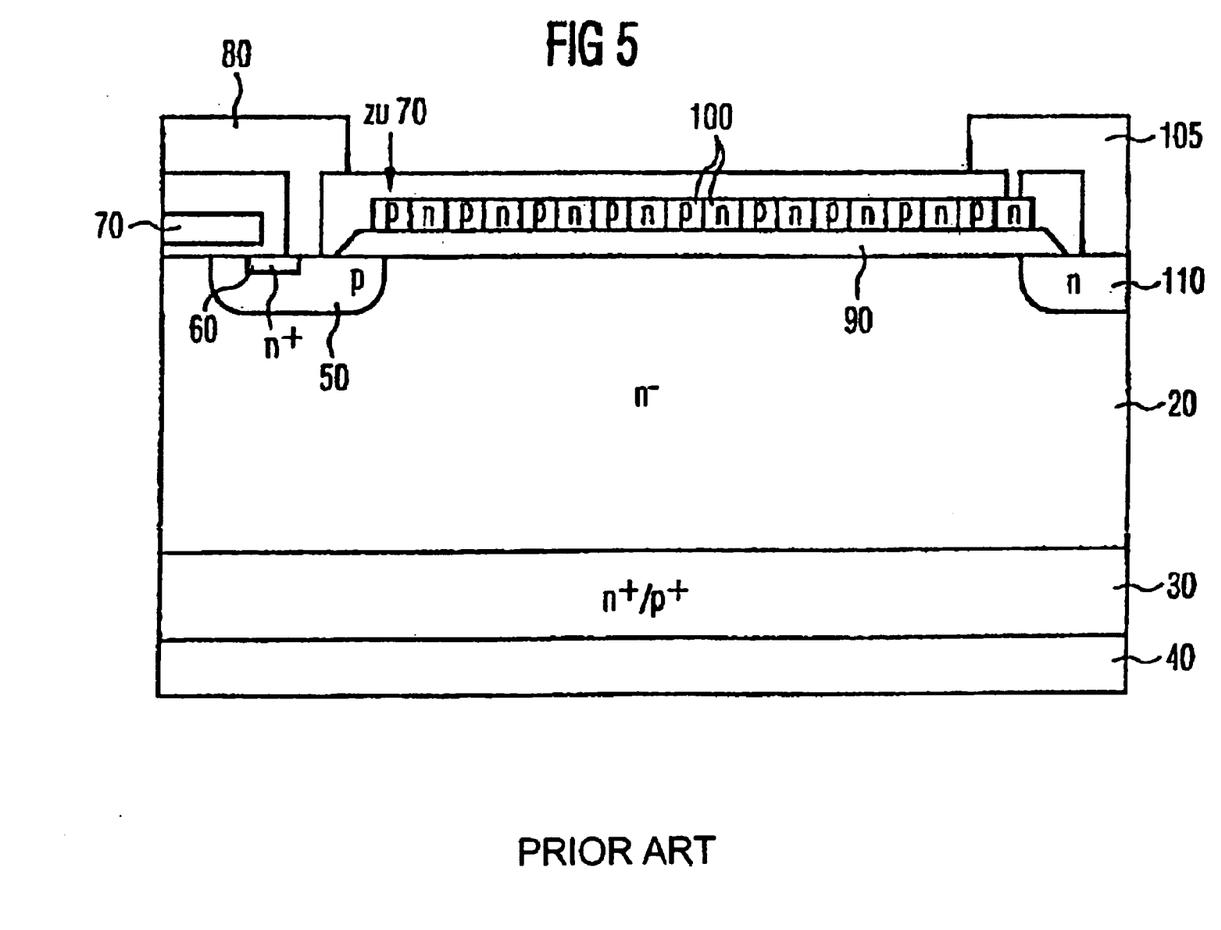
FIG. 5 shows a diagrammatic illustration of a known semiconductor component.

FIG. 5 shows a diagrammatic illustration of a known semiconductor component.

FIG. 5 shows the basic construction of an IGBT or power transistor (depending on whether the region 30 is $n^+$- or $p^+$-conducting) with an integrated active zener protection in silicon technology.

In FIG. 5, 40 designates a rear-side metalization layer as drain terminal or collector terminal, 30 designates a drain region ($n^+$) or a collector region ($p^+$), 20 designates a first base region of the $n^-$ conduction type, 50 designates a second base region of the p conduction type, 60 designates a source region or emitter region of the $n^+$ conduction type, 90 designates an insulator layer in the form of an oxide layer, 70 designates a gate, 100 designates a zener diode chain which, at one end, is connected to the gate 70 and, at the other end, is connected via a contact bridge 105 to an n-type well 110 within the first base region 20.

The zener diode chain 100 is realized by a series circuit of a plurality of polysilicon zener diodes which are insulated from the active region of the semiconductor component by means of the oxide layer 90.

In this connection, there are various possibilities for configuring the edge termination. A further example for the edge termination is constituted by floating field rings, as known from Z. John Shen et al. (aaO).

Figure 6:
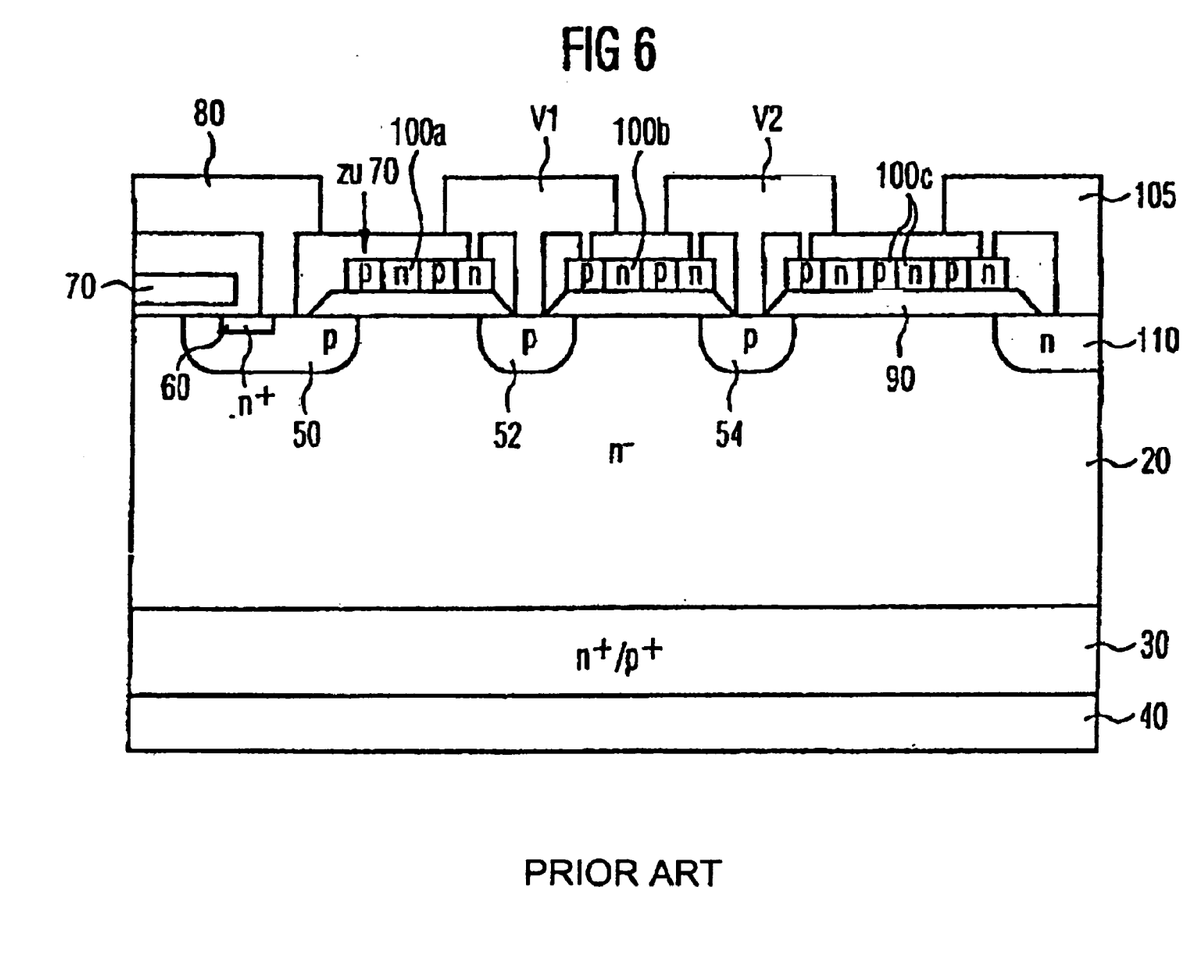
FIG. 6 shows a diagrammatic illustration of a further known semiconductor component.

FIG. 6 shows a diagrammatic illustration of a further known semiconductor component.

In accordance with FIG. 6, two floating field rings of the p conduction type 52, 54 are provided, which are connected via the connecting regions V1, V2 to the zener diode chain divided into three parts 100a, b, c.

Figure 7:
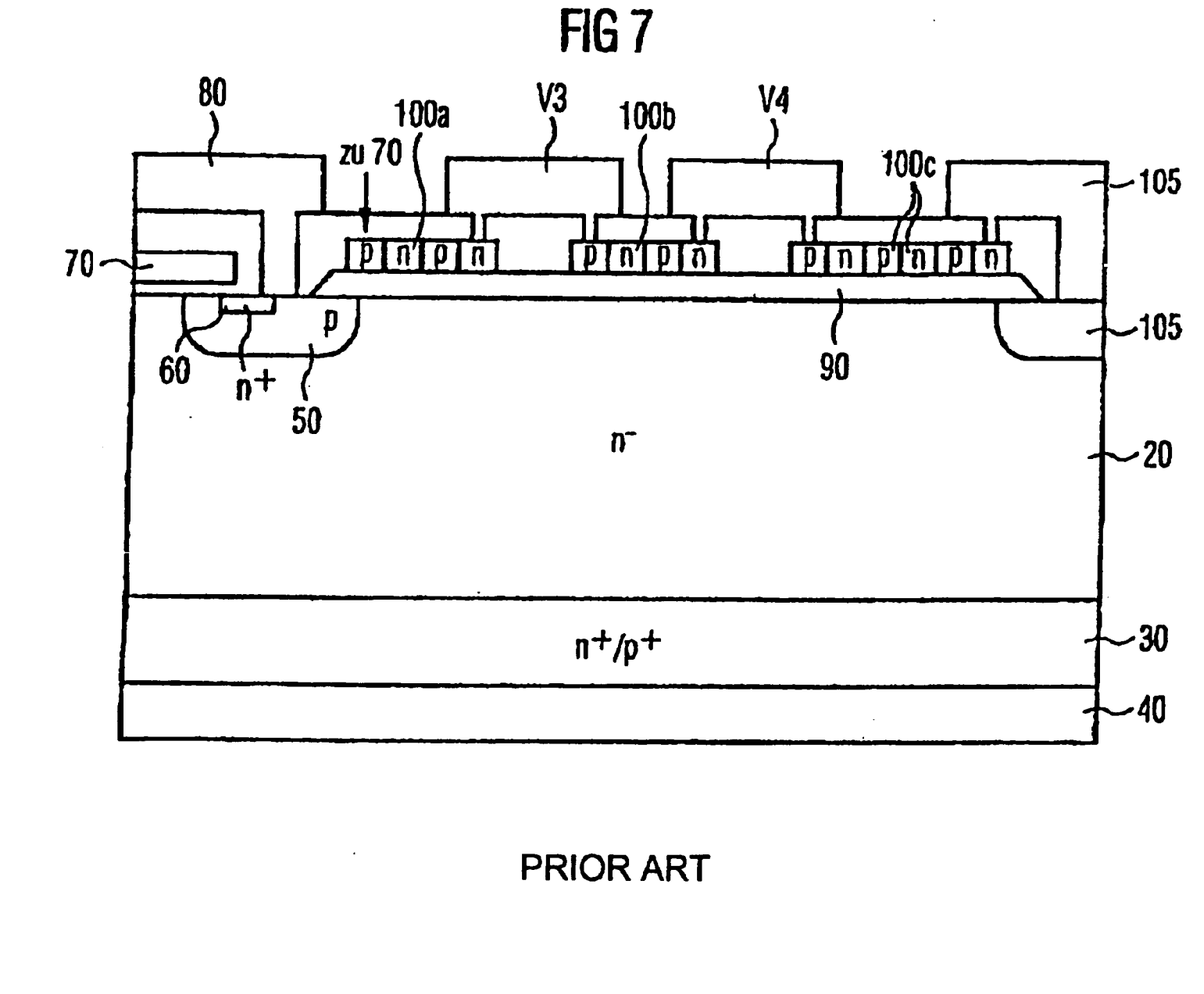
FIG. 7 shows a diagrammatic illustration of yet another known semiconductor component.

FIG. 7 shows a diagrammatic illustration of yet another known semiconductor component.

In accordance with FIG. 7, field plates V3, V4 are provided in order to connect the zener diode chain divided into three parts 100a, b, c.

SUMMARY OF THE INVENTION

It is an object of the present invention to develop further the semiconductor component mentioned in the introduction in such a way that it can be tested better. A further object is to provide a corresponding test method.

According to the invention, this object is achieved by means of the semiconductor component specified in claim 1 and by means of the test method specified in claim 11.

The idea underlying the present invention is that the first diode device has a first external contact-making region for connection to the first main terminal. In other words, the active zener protection is initially still not connected at the wafer level, so that the zener voltage and the avalanche voltage can be measured independently of one another. In the course of mounting in a housing, the zener protection is connected by means of a small additional outlay in the form of a bonding from the lead frame onto a contact-making region on the chip. Further appropriate measures can be taken to ensure that the avalanche voltage is not corrupted by the zener diode chain that is arranged in the edge region and not yet connected.

The essential advantage of the configuration according to the invention is that the zener voltage and the avalanche voltage can be measured separately from one another, so that it is possible to guarantee a safety margin of sufficient size between zener voltage and avalanche voltage, to be precise already at the wafer level. As a result, on the one hand it is possible to guarantee and test a safety margin between the zener voltage and the avalanche voltage, and on the other hand this safety margin can be dimensioned more narrowly owing to its testability, which benefits other properties of the semiconductor component, e.g. its on resistance.

Finally, components with an excessively small safety margin can be removed by sorting as early as at the wafer level, rather than not until after mounting and UIS test. This contributes further to saving costs.

Advantageous developments and improvements of the semiconductor component specified in claim 1 can be found in the subclaims.

In accordance with one preferred development, the first external contact-making region has a bonding pad.

In accordance with a further preferred development, the first external contact-making region is connected via a bonding connection to a substrate, preferably a lead frame, with which the first main terminal is in electrical contact.

In accordance with a further preferred development, a second diode device is connected in series with the first diode device between that end of the first diode device which is connected to the first external contact-making region and the first main terminal, which diode device has a second breakdown voltage such that the sum of the first and second breakdown voltages is greater than a predetermined lower limit of the breakdown voltage of the semiconductor element between the first and second main terminals.

In accordance with a further preferred development, the second diode device has a second external contact-making region for the external connection of the end not connected to the first diode device.

In accordance with a further preferred development, the first and/or the second diode device are a zener diode device.

In accordance with a further preferred development, the semiconductor component is a vertical DMOS transistor or a vertical IGBT transistor.

In accordance with a further preferred development, the second diode device is connected to the first main terminal via an intermediate region of a first conduction type.

In accordance with a further preferred development, a well of a second conduction type is provided in the intermediate region, which well is connected to the first diode device, the well and the intermediate region forming at least part of the second diode device.

In accordance with a further preferred development, the semiconductor component is constructed in silicon technology.

Exemplary embodiments of the invention are illustrated in the drawings and explained in more detail in the description below.

DETAILED DESCRIPTION OF THE INVENTION

In the figures, identical reference symbols designate identical or functionally identical elements.

Figure 1:
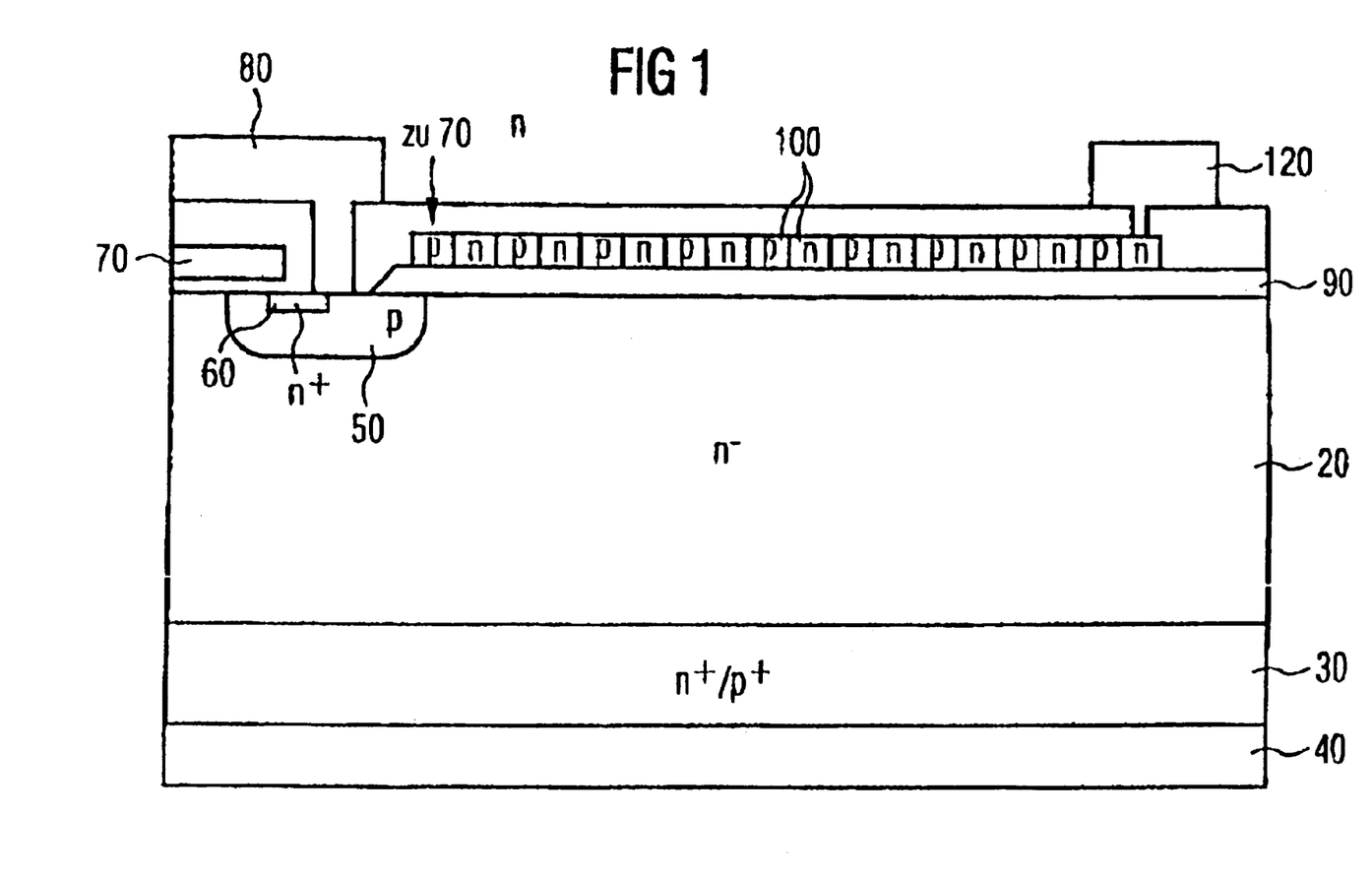
FIG. 1 shows a diagrammatic illustration of a semiconductor component as first embodiment of the present invention.
Figure 2:
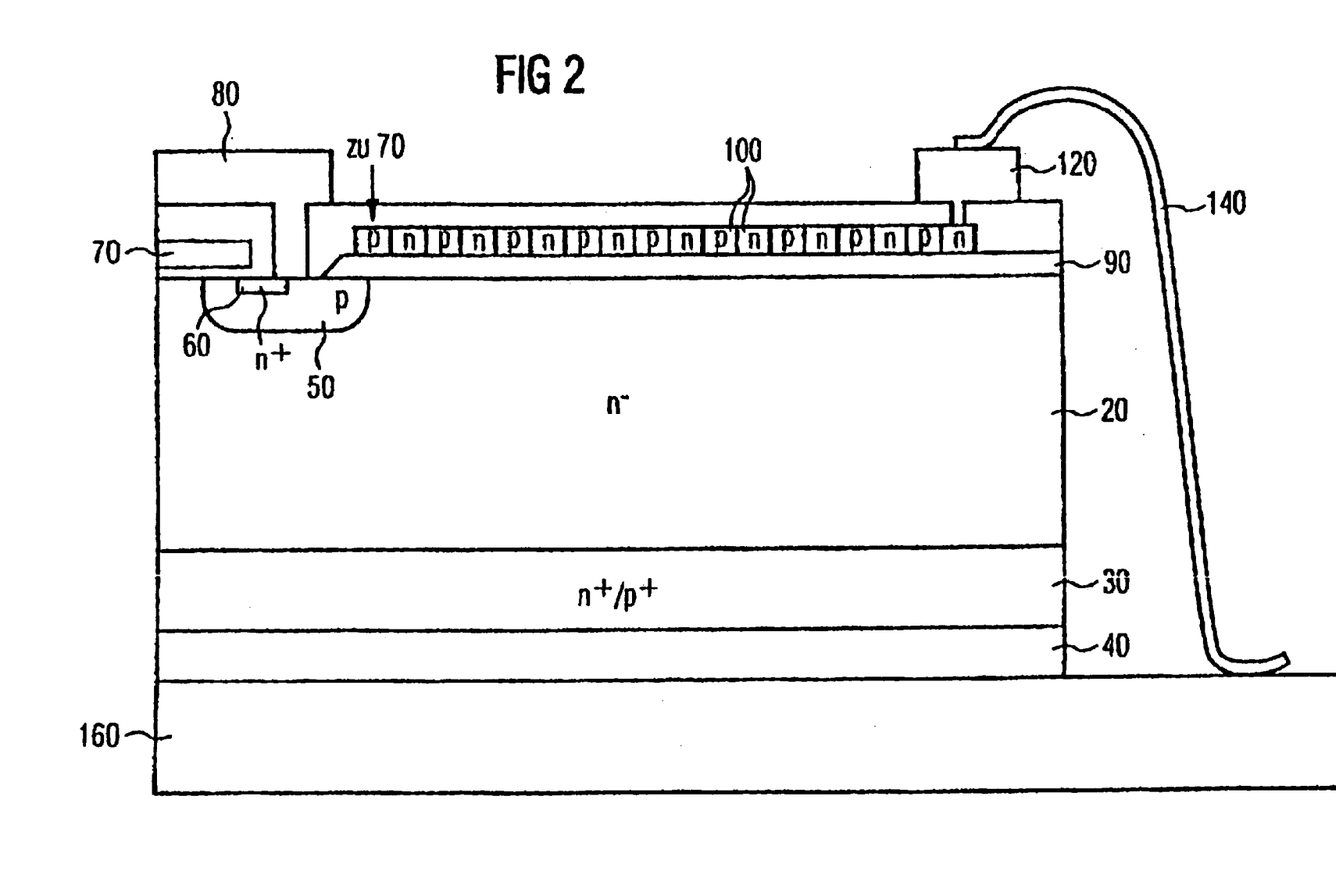
FIG. 2 shows a diagrammatic illustration of the semiconductor component according to FIG. 1 in the connected state.

FIG. 1 shows a diagrammatic illustration of a semiconductor component as first embodiment of the present invention, and FIG. 2 shows a diagrammatic illustration of the semiconductor component according to FIG. 1 in the connected state.

In accordance with the first embodiment according to FIG. 1, in contrast to the prior art in accordance with FIG. 5, the right-hand end of the zener diode chain 100 is not connected to the first base region 20, but rather has a first contact-making region 120 in the form of a bonding pad which is uncovered on the top side of the wafer. This bonding pad may serve both for measurement and as an area for fitting a bonding wire 140, as is illustrated in FIG. 2, the bonding wire being connected there to a lead frame 160, with which the rear-side metalization layer 40 of the drain terminal or collector terminal 30 is in electrical contact.

In this arrangement, then, it is possible to measure, at the wafer level (state according to FIG. 1), the avalanche voltage between the drain contact or collector contact 40 and the source contact or the emitter contact 80 independently of the zener voltage. By contrast, the zener voltage can be determined by a simple measurement between the gate 70 and the first contact-making region 120. It is not until during mounting that the active zener protection is connected by a bonding wire 140 between the lead frame and the first contact-making region 120 (state in accordance with FIG. 2).

Figure 3:
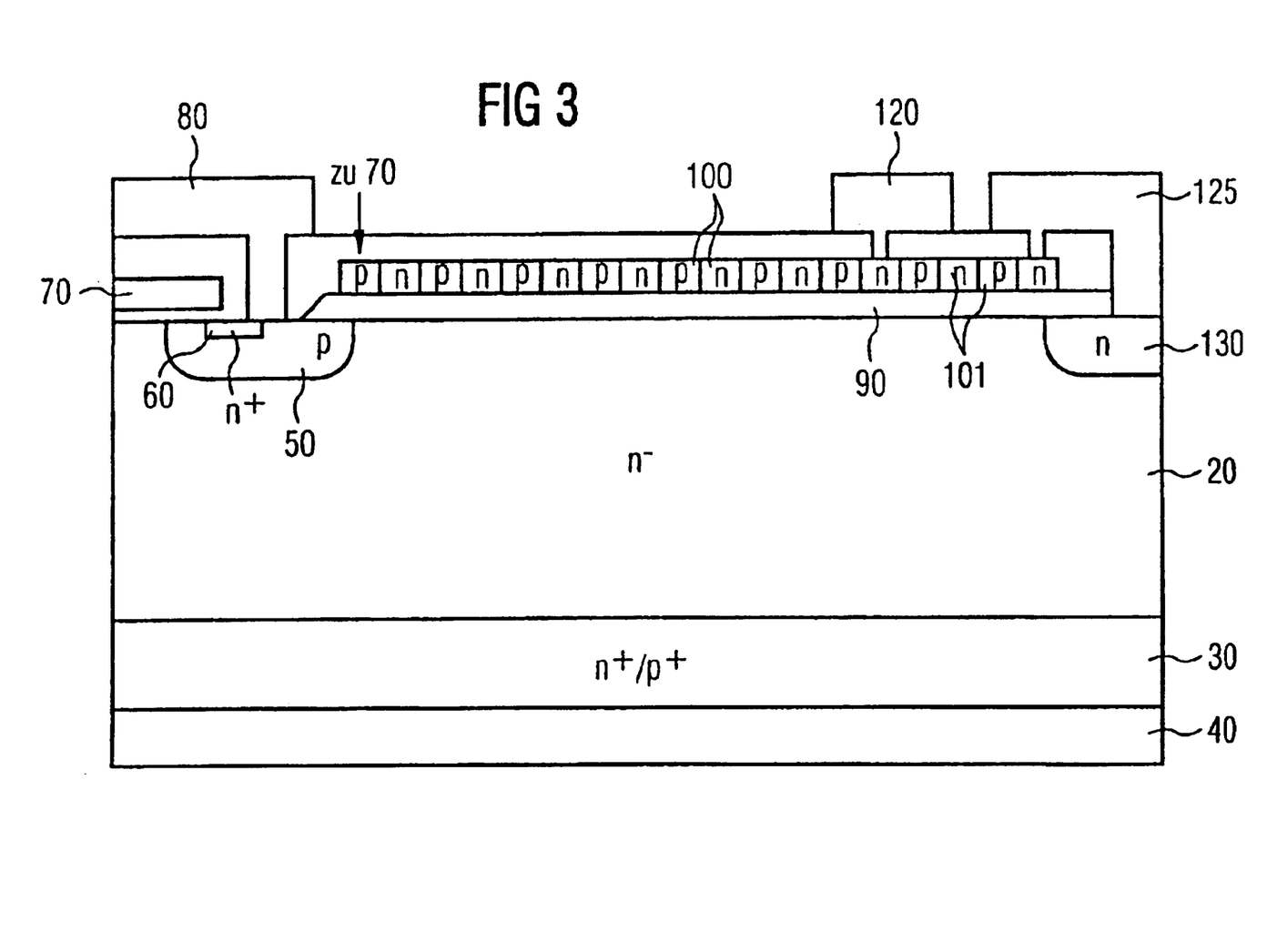
FIG. 3 shows a diagrammatic illustration of a semiconductor component as second embodiment of the present invention.

FIG. 3 shows a diagrammatic illustration of a semiconductor component as second embodiment of the present invention.

In this second exemplary embodiment, the first contact-making region 120 is connected via a second zener diode chain 101, the second contact-making region and the n-type well 130 to the first base region 20 and thus to the drain potential or collector potential. This embodiment is useful in particular for ensuring that the avalanche voltage is not corrupted by the zener diode chain that is arranged in the edge region and not yet connected. In particular, by virtue of this measure, during the measurement of the avalanche voltage, the first zener diode chain 100 is put at a high voltage (of course below the zener voltage). In this case, the breakdown voltage of the second zener diode chain 101 is chosen such that the sum of it and the zener voltage of the first zener diode chain is greater than the avalanche voltage to be measured or the lower limit defined during the measurement of the avalanche voltage. In the present case, the first zener diode chain 100 has a reverse voltage of 400 V and the second zener diode chain 101 has a reverse voltage of 100 V, so that the total reverse voltage amounts to 500 V.

Accordingly, components which are considered as good during the measurement are those which have an avalanche voltage of e.g. at least 440 V, if the invention is to comply with a safety margin of 40 V with respect to the breakdown voltage of the first zener diode chain. As in the first exemplary embodiment, the zener diode bonding pad 120 is connected to the lead frame 160 by a bonding wire 140 during mounting.

Figure 4:
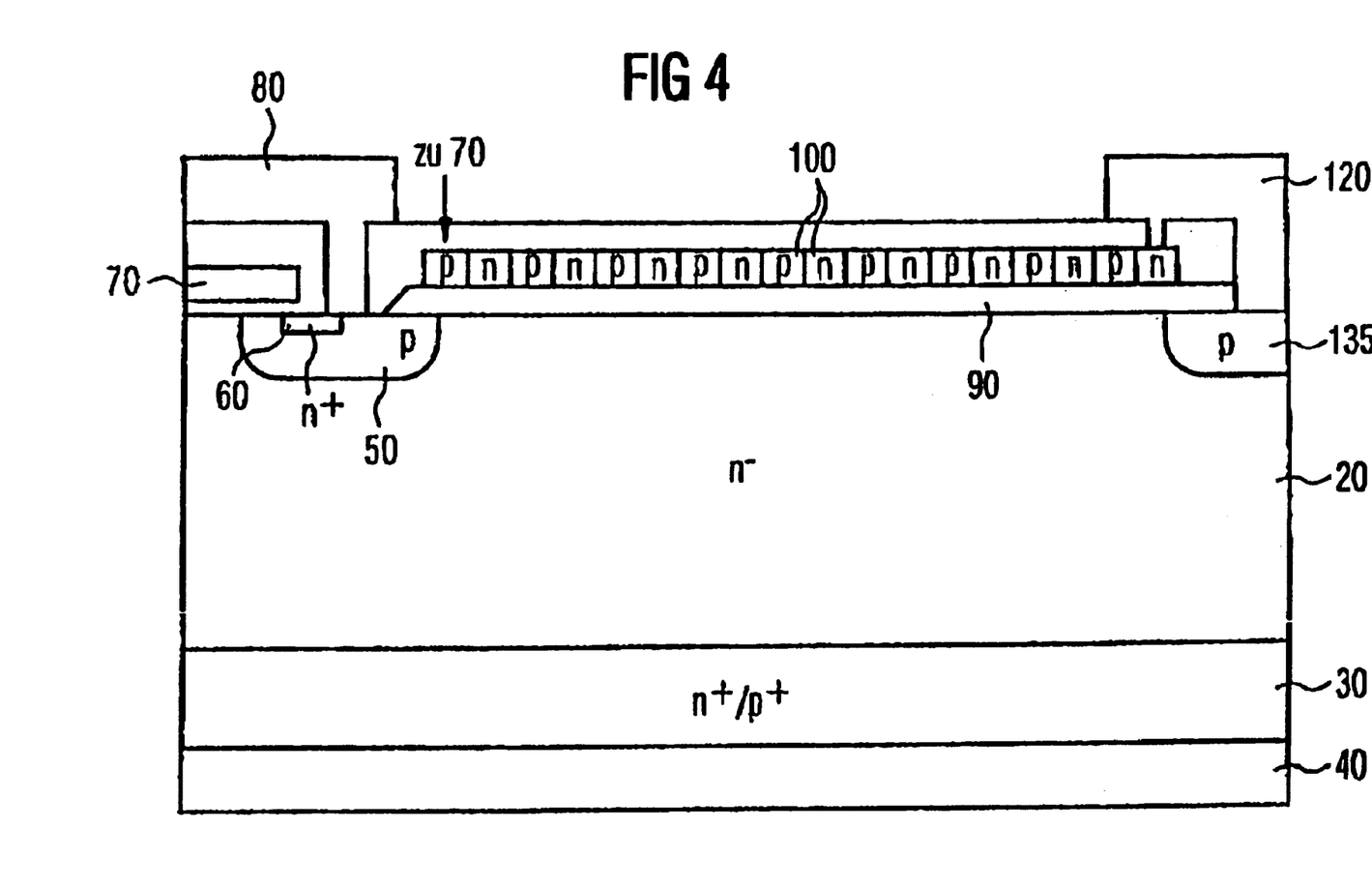
FIG. 4 shows a diagrammatic illustration of a semiconductor component as third embodiment of the present invention.

FIG. 4 shows a diagrammatic illustration of a semiconductor component as third embodiment of the present invention.

In the third exemplary embodiment in accordance with FIG. 4, the same effect obtained in the second exemplary embodiment by means of the second zener diode chain 101 is achieved by means of an integrated pn diode comprising the p-type well 135 and the first base region 20. As in the first two exemplary embodiments, the bonding pad 120 is connected to the lead frame 160 by a bond 140 during mounting in this case as well.

Although the present invention has been described above using preferred exemplary embodiments, it is not restricted thereto, but rather can be modified in diverse ways.

In particular, the precise construction of the edge termination of the semiconductor component is independent of the invention and can be configured according to the known structures in accordance with FIGS. 1 to 3.

Moreover, the present invention is not restricted to the IGBT or DMOS transistor portrayed, but rather can be applied to an arbitrary more complicated structure, e.g. a thyristor structure.

| List of Reference Symbols | |
|---|---|
| 40 | Drain terminal or collector terminal |
| 30 | Drain or collector region |
| 20 | First base region |
| 50 | Second base region |
| 60 | Source region or emitter region |
| 80 | Source terminal or emitter terminal |
| 70 | Gate |
| 100; 100a, 100b, 100c | First diode device, zener diode chain |
| 90 | Insulator layer, oxide layer |
| 120 | First contact-making region |
| 140 | Bonding wire |
| 101 | Second diode device |
| 125 | Second contact-making region |
| 130 | n-type well |
| 135 | p-type well |
| 105 | Contact bridge |

| List of Reference Symbols | |
|---|---|
| 110 | n-type well |
| V1, V2 | Connecting regions |
| V3, V4 | Field plates |
| 52, 54 | Field rings |

What is claimed is:

1. A semiconductor component having:
   (a) a first main terminal;
   (b) a second main terminal;
   (c) a control terminal for controlling the current flowing between the main terminals; and
   (d) a first diode device, which can be connected between the first main terminal and the control terminal and has a first breakdown voltage such that it short-circuits the first main terminal to the control terminal and thus switches on the semiconductor component, if the voltage dropped across the first diode device exceeds a predetermined value; the first diode device have a first end being connected to the control terminal in an integrated manner; and the first diode means having a second end being not electrically connected to the first main terminal and being connected to a first external contact-making region.

2. The semiconductor component according to claim 1, wherein the first external contact-making region has a bonding pad.

3. The semiconductor component according to claim 1, wherein it is constructed using silicon technology.

4. A test method for testing the semiconductor component according to claim 1, wherein, in a first step, a first test voltage is applied between the first and second main terminals and, in a second step, a second test voltage is applied between the first external contact-making region and the control terminal, and thereafter the first external contact-making region is connected to a substrate to which the first main terminal is electrically connected.

5. A semiconductor component having:
   (a) a first main terminal;
   (b) a second main terminal;
   (c) a control terminal for controlling the current flowing between the main terminals;
   (d) a first diode device, which can be connected between the first main terminal and the control terminal and has a first breakdown voltage such that it short-circuits the first main terminal to the control terminal and thus switches on the semiconductor component, if the voltage dropped across the first diode device exceeds a predetermined value; the first diode device having a first end being connected to the control terminal in an integrated manner; said first diode device having a second end being connected with a first external contact-making region; and
   (e) wherein a second diode device is connected between the second end of the first diode device and the first main terminal in series with the first diode device, which second diode device has a second breakdown voltage such that the sum of the first and second breakdown voltages is greater than a predetermined lower limit of the breakdown voltage of the semiconductor component between the first and second main terminals; and wherein the second diode device is electrically connected to the first main terminal via an intermediate region of a first conduction type.

6. The semiconductor component according to claim 5, wherein an end of the second diode device which is not connected to the first diode device is connected with a second external contact-making region which is externally connected to said intermediate region.

7. The semiconductor component according to claim 5, wherein the first and/or the second diode device is a zener diode device.

8. The semiconductor component according to claim 7, wherein it is a vertical DMOS transistor or a vertical IGBT transistor.

9. The semiconductor component according to claim 8, wherein a well of a second conduction type is provided in the intermediate region, which well is connected to the first diode device, the well and the intermediate region forming at least part of the second diode device.

10. A test method for testing the semiconductor component according to claim 5, wherein in a first step, a first test voltage is applied between the first and second main terminals and, in a second step, a second test voltage is applied between the first external contact-making region and the control terminal, and thereafter the first external contact-making region is connected to a substrate to which the first main terminal is electrically connected.

* * * * *